US012805277B2

(12) United States Patent
Kang et al.

(10) Patent No.: US 12,805,277 B2
(45) Date of Patent: Nov. 17, 2026

(54) AIRGAP IN SINGLE DIFFUSION BREAK

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 400 days.

(21) Appl. No.: 18/532,608

(22) Filed: Dec. 7, 2023

(65) Prior Publication Data

US 2025/0194168 A1 Jun. 12, 2025

(51) Int. Cl.

| | |
|---|---|
| ***H10W 10/00*** | (2026.01) |
| ***H10D 30/01*** | (2025.01) |
| ***H10D 62/10*** | (2025.01) |
| ***H10D 84/01*** | (2026.01) |
| ***H10D 84/83*** | (2025.01) |
| ***H10W 10/20*** | (2026.01) |

(52) U.S. Cl.

CPC ...... *H10W 10/021* (2026.01); *H10D 84/0151* (2025.01); *H10D 84/832* (2025.01); *H10W 10/20* (2026.01); *H10D 30/0198* (2025.01); *H10D 62/116* (2025.01); *H10D 62/121* (2025.01)

(58) Field of Classification Search

CPC ............... H10W 10/021; H10W 10/20; H10D 84/0151; H10D 84/832; H10D 30/0198; H10D 62/116; H10D 62/121; H10D 30/501; H10D 64/017; H10D 64/251; H10D 30/6735; H10D 62/115; B82Y 10/00; H01L 29/0607; H01L 29/0673; H01L 21/764

See application file for complete search history.

(56) References Cited

U.S. PATENT DOCUMENTS

| | | | | |
|---|---|---|---|---|
| 9,412,616 | B1 | 8/2016 | Xie et al. | |
| 9,589,845 | B1 | 3/2017 | Jagannathan et al. | |
| 10,014,370 | B1 | 7/2018 | Xie et al. | |
| 11,450,659 | B2 | 9/2022 | Reznicek et al. | |
| 12,538,553 | B2 * | 1/2026 | Xie | H10D 30/6735 |
| 2023/0110073 | A1 | 4/2023 | Xie et al. | |
| 2023/0178437 | A1 | 6/2023 | Xie et al. | |
| 2023/0178596 | A1 | 6/2023 | Zhou et al. | |
| 2023/0260909 | A1 | 8/2023 | Yeoh et al. | |
| 2024/0204067 | A1 * | 6/2024 | Xie | H10D 30/6735 |

(Continued)

OTHER PUBLICATIONS

No Author, "Dielectric Thin Films", MKS, Dec. 2, 2023, 18 pages, link: https://www.mks.com/n/dielectric-thin-films.

*Primary Examiner* — Earl N Taylor

(74) *Attorney, Agent, or Firm* — Scully, Scott, Murphy & Presser, P.C.; Kristofer Haggerty

(57) ABSTRACT

A semiconductor structure including a single diffusion break (SDB) containing an airgap located between neighboring source/drain regions is provided. The airgap has an upper region that has a first width and a lower region that has a second width that is less than the first width. The airgap is pinched off on the backside of the structure in a region that is in close proximity to a backside interconnect structure. The presence of the airgap containing SDB can minimize capacitance as well as leakage of the structure.

20 Claims, 4 Drawing Sheets

(56) References Cited

U.S. PATENT DOCUMENTS

| | | | | |
|---|---|---|---|---|
| 2024/0297167 | A1* | 9/2024 | Xie | H10D 89/10 |
| 2025/0126829 | A1* | 4/2025 | Kang | H10D 30/611 |
| 2025/0185337 | A1* | 6/2025 | Qin | H10D 64/254 |

* cited by examiner

AIRGAP IN SINGLE DIFFUSION BREAK

BACKGROUND

The present application relates to semiconductor technology, and more particularly to a semiconductor structure including a single diffusion break including an airgap.

The myriad of transistors that are formed as part of an integrated circuit (IC) need to be electrically isolated from one another to properly function in an electrical circuit. Normally, this is achieved by forming a trench in a semiconductor substrate and then filling that trench with a trench dielectric material (e.g., silicon oxide). Such dielectric filled isolation trenches can be referred to a diffusion break. An individual transistor of an IC may be electrically isolated from other transistors using a single diffusion break (SDB). SDB technology can be used to reduce the distance between active device areas and enable area-scaling.

SUMMARY

A semiconductor structure including a SDB containing an airgap located between neighboring source/drain regions is provided. The airgap has an upper region that has a first width and a lower region that has a second width that is less than the first width. The airgap is pinched off on the backside of the structure in a region that is in close proximity to a backside interconnect structure. The presence of the airgap containing SDB can minimize capacitance as well as leakage of the structure.

In one aspect of the present application, a semiconductor structure having minimized capacitance is provided. In one embodiment of the present application, the semiconductor structure includes a pair of neighboring transistors, each transistor of the pair of neighboring transistors includes source/drain regions located on opposite sides of a gate structure. A first backside interlayer dielectric (ILD) layer is located beneath each of the transistors and the source/drain regions. A SDB containing an airgap is located between the source/drain regions of the pair of neighboring transistors and extends through the first backside ILD layer. The airgap has an upper region having a first width adjacent to the source/drain regions and a lower region having a second width that is less than the first width adjacent to the first backside ILD layer.

In another embodiment, the semiconductor structure includes a pair of neighboring nanosheet transistors, each nanosheet transistor of the pair of neighboring nanosheet transistors comprises source/drain regions located on opposite sides of a gate structure. A bottom dielectric isolation layer is located beneath each nanosheet transistor and the source/drain regions and a first backside interlayer dielectric (ILD) layer located beneath the bottom dielectric isolation layer. A single diffusion break (SDB) containing an airgap is located between the source/drain regions of the pair of neighboring transistors and extending through bottom dielectric isolation layer and the first backside ILD layer. The airgap has an upper region having a first width adjacent to the source/drain regions and a lower region having a second width that is less than the first width adjacent to the first backside ILD layer.

In another aspect of the present application, a method of forming a semiconductor structure is provided. In one embodiment, the method includes forming a single diffusion break region between source/drain regions of a neighboring pair of sacrificial gate structures, the single diffusion break region extending into a semiconductor substrate. A sacrificial semiconductor placeholder structure and a frontside interlayer dielectric (ILD) layer are then formed in the single diffusion break region. Next, each sacrificial gate structure is replaced with a functional gate structure. The semiconductor substrate is then removed, and thereafter a first backside ILD layer is formed embedding the sacrificial semiconductor placeholder structure. Next, the sacrificial semiconductor placeholder structure is removed and thereafter, an airgap containing SDB is formed in a lower portion of the single diffusion break region.

DETAILED DESCRIPTION

Figure 2:
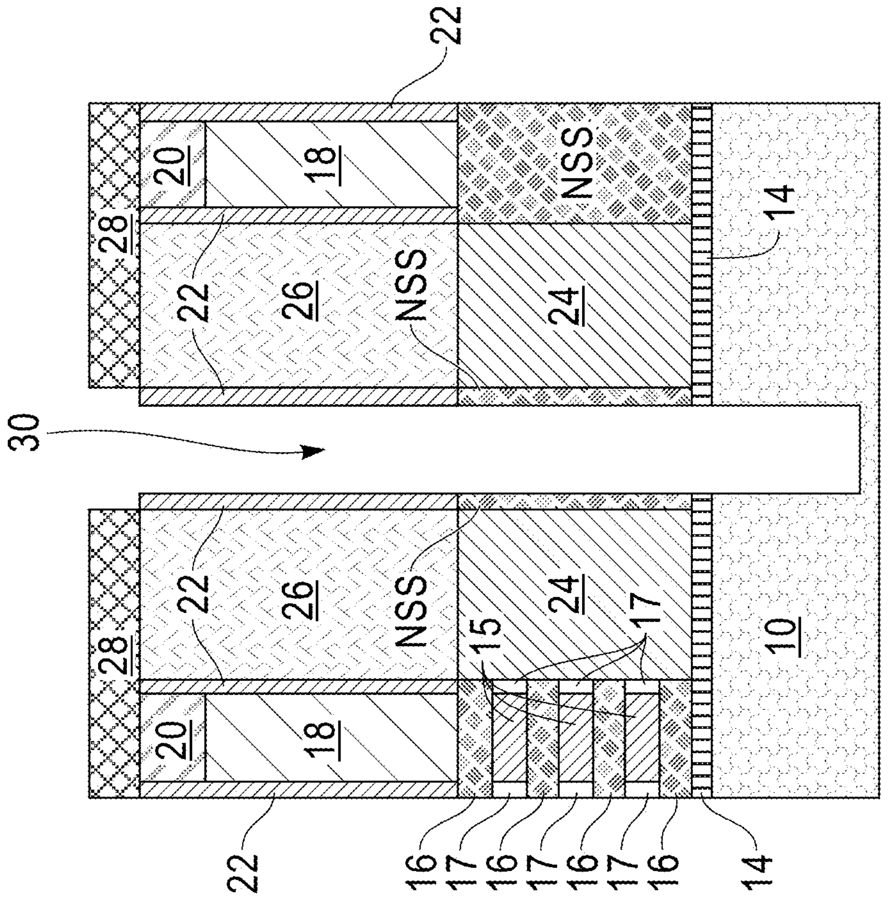
FIG. 2 is a cross sectional of an exemplary semiconductor structure along X-X shown in FIG. 1 that can be employed in the present application, the exemplary semiconductor structure includes a pair of precursor nanosheet transistors in which a single diffusion break region is formed between the source/drain regions of this pair of precursor nanosheet transistors.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

As mentioned above, SDB can be used to electrically isolate one transistor from another transistor. Conventional SDB is composed of a solid dielectric pillar that extends from the surface of the substrate. SDB can provide reduced distance between the active device areas and can enable area-scaling. Despite the above advantages, SDB can cause capacitance issues between neighboring source/drain regions. A need thus exists to provide SDB in which the capacitance between neighboring source/drain regions can be reduced.

The above capacitance problem can be mitigated by providing a semiconductor structure including an airgap containing SDB that is located between neighboring source/drain regions. The airgap has an upper region that has a first width and a lower region that has a second width that is less than the first width. The airgap is pinched off on the backside of the structure in a region that is in proximity to a backside interconnect structure. In the present application, the airgap containing SDB is at the level of the source/drain regions and can extend into a backside interlayer dielectric layer. In embodiments, the airgap containing SDB can minimize leakage as well as capacitance.

In addition to describing a semiconductor structure, the present application also describes a method of forming the same. The method, which is illustrated, for example, in FIGS. 2-7 includes forming a single diffusion break region 30 between source/drain regions 24 of a neighboring pair of sacrificial gate structures 18, the single diffusion break region 30 extending into a semiconductor substrate 10. A sacrificial semiconductor placeholder structure 32 and a frontside ILD layer 34 are then formed in the single diffusion break region 30. Next, each sacrificial gate structure 18 is replaced with a functional gate structure 36. The semiconductor substrate 10 is then removed, and thereafter a first backside ILD layer 44 is formed embedding the sacrificial semiconductor placeholder structure 32. Next, the sacrificial semiconductor placeholder structure 32 is removed and thereafter, an airgap containing SDB (including airgap 48 and SDB dielectric layer 46) is formed in a lower portion of the single diffusion break region 30.

In the present application, a semiconductor structure is described and illustrated as containing nanosheet transistors. A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps each of the spaced apart semiconductor channel material nanosheets.

Although the present application describes and illustrates a semiconductor structure including nanosheet transistors, the present application works with other types of non-planar transistors which can include, stacked nanosheet transistors, finFETs, nanowire transistors or any combination of such transistors including the nanosheet transistors described and illustrated herein.

Figure 1:
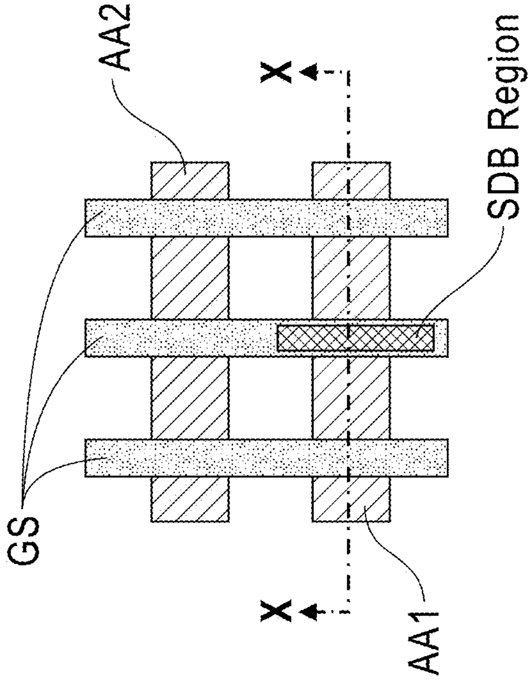
FIG. 1 is a top down view showing a device layout that can be employed in the present application, a cut X-X is including in FIG. 1.

Referring first to FIG. 1, there is illustrated a top down view showing a device layout that can be employed in the present application. The exemplary device layout illustrated in FIG. 1 includes two active device areas, i.e., AA1 and AA2. Each of the active device areas, i.e., AA1 and AA2, run parallel to each other. The device layout illustrated in FIG. 1 also includes a plurality of gate structures, GS, which run parallel to each other and perpendicular to each of the active device areas, i.e., AA1 and AA2. As is further illustrated in FIG. 1, each of the gate structures passes over the two active device regions. The device layout illustrated in FIG. 1 also includes a SDB Region which will include the airgap containing SDB of the present application. Cut X-X is present in FIG. 1. This cut is located along the length wise direction of AA1 and is present in a central portion of AA1. The SDB Region is present between the first GS and the third GS illustrated in FIG. 1.

Referring now to FIG. 2, there is illustrated an exemplary semiconductor structure that can be employed in the present application. The exemplary semiconductor structure illustrated in FIG. 1 includes a pair of precursor nanosheet transistors in which a single diffusion break region 30 is formed between the source/drain regions 24 of this pair of precursor nanosheet transistors. In the present application, a precursor nanosheet transistor is a structure that includes a nanosheet stack of alternating semiconductor channel material nanosheets 16 and sacrificial semiconductor channel material nanosheets 15 in which a sacrificial gate structure 18 is located thereon. Notably, the sacrificial gate structure 18 straddles over a topmost surface and is present along sidewall surfaces of the nanosheet stack. The precursor nanosheet transistor also includes inner spacer 17 located adjacent to each sacrificial semiconductor material nanosheet 15, an bottom dielectric isolation layer 14 (which is optional in some embodiments) located beneath the nanosheet stack and the source/drain regions 24, a hard mask cap 20 (which is also optional in some embodiments) located on the sacrificial gate structure 18, a gate spacer 22 located adjacent to at least the sacrificial gate structure 18 and, if present, the hard mask cap 20. The precursor nanosheet transistor also includes source/drain regions 24 that extend from sidewalls of each semiconductor channel material nanosheet 16 of the nanosheet stack. In the illustrated embodiment, each of the source/drain regions 24 is present on the bottom dielectric isolation layer 14. Note that the left hand side of FIG. 2 details a nanosheet stack structure of semiconductor channel material nanosheets 16, sacrificial semiconductor material nanosheets 15 and the inner spacers 17. On the right hand side of FIG. 2, the nanosheet stack structure of semiconductor channel material nanosheets 16, sacrificial semiconductor material nanosheets 15 and the inner spacers 17 is represented by a single block labeled as NSS (nanosheet stack structure).

The semiconductor substrate 10 is composed of at least one semiconductor material having semiconducting properties. In the present application, the at least one semiconductor material can be referred to as a first semiconductor material. Examples of first semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments (not shown), the semiconductor substrate 10 can be composed of a first semiconductor layer, an etch stop layer, and a second semiconductor layer. The first semiconductor layer and the second semiconductor layer include one of the above mentioned first semiconductor materials. In embodiments, the semiconductor material that provides the first semiconductor layer can be compositionally the same as, or compositionally different from, the semiconductor material that provides the second semiconductor layer. In some embodiments, the etch stop layer can be composed of a dielectric material such as, for example, silicon dioxide and/or boron nitride. In other embodiments, the etch stop layer is composed of a semiconductor material that is compositionally different from the semiconductor material that provides the first semiconductor layer and the semiconductor material that provides the second semiconductor layer. In one example, the first semiconductor layer is composed of silicon, the etch stop layer is composed of silicon dioxide, and the second semiconductor layer is composed of silicon. In another example, the first semiconductor layer is composed of silicon, the etch stop layer is composed of silicon germanium, and the second semiconductor layer is composed of silicon.

In some embodiments (not shown) a shallow trench isolation structure can be present in the semiconductor substrate 10. When present, the shallow trench isolation structure is composed of any trench dielectric material such as, for example, silicon oxide. In some embodiments, a trench dielectric liner composed of, for example, SiN, can be present along a sidewall and a bottom wall of the trench dielectric material. The shallow trench isolation structure is located in an upper portion of the semiconductor substrate 10 and it typically has a topmost surface that is substantially coplanar with a topmost surface of the semiconductor substrate 10.

The nanosheet stack of alternating semiconductor channel material nanosheets 16 and sacrificial semiconductor material nanosheets 15 can include any number of sacrificial semiconductor material nanosheets 15 and any number of semiconductor channel material nanosheets 16 and is not limited to the number of sacrificial semiconductor material nanosheets 15 and semiconductor channel material nanosheets 16 illustrated in the drawings. Each sacrificial semiconductor material nanosheets 15 is composed of a second semiconductor material and each semiconductor channel material nanosheets 16 is composed of a third semiconductor material. In the present application, the second semiconductor material is compositionally different from the third semiconductor material. The second and third semiconductor materials include one of the first semiconductor materials mentioned above. In one example, the second semiconductor material that provides each sacrificial semiconductor material nanosheet 15 is composed of a silicon germanium alloy having a germanium content from 20 atomic percent to 40 atomic percent, and the third semiconductor material that provides each semiconductor channel material nanosheet 16 is composed of silicon.

The gate spacer 22, the inner spacer 17 and the bottom dielectric isolation layer 14 are all composed of a spacer dielectric material. Typically, the gate spacer 22 and the bottom dielectric isolation layer 14 are composed of a compositionally same spacer dielectric material since they are oftentimes formed at the same time. Illustrative examples of spacer dielectric materials that can be employed in the present application include, but are not limited to, silicon dioxide, SiN, SiBCN, SiOCN or SiOC.

The sacrificial gate structure 18 includes at least a sacrificial gate material. In some embodiments, the sacrificial gate structure 18 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. The hard mask cap 20 that can be present on the sacrificial gate structure 18 is composed of a hard mask material such as, for example, silicon nitride or silicon oxynitride.

The source/drain regions 24 are composed of a fourth semiconductor material and a dopant. As used herein, a "source/drain" region can be a source region or a drain region depending on subsequent wiring and application of voltages during operation of the transistor. The fourth semiconductor material includes one of the semiconductor materials mentioned above for the semiconductor substrate 10 and the fourth semiconductor material can be compositionally the same as, or compositionally different from the third semiconductor material that provides each semiconductor channel material nanosheet 16. The dopant can be an n-type dopant or a p-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region can have a dopant concentration of from $4\times10^{20}$ atoms/cm$^3$ to $3\times10^{21}$ atoms/cm$^3$.

The first frontside ILD layer 26 is composed of a composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 (all dielectric constants mentioned herein are relative to a vacuum unless otherwise noted).

The precursor nanosheet transistors illustrated in FIG. 2 can be formed utilizing any well-known nanosheet transistor device formation process. So as not to obscure any aspect of the method of the present application, the details regarding the precursor nanosheet transistors formation are not provided herein.

The single diffusion break region 30 is provided by lithography and etching. Lithography includes forming at least a photoresist material on a layer or stack of material layers that need to be patterned, exposing the photoresist material to a desired pattern of irradiation and thereafter developing the exposed photoresist material utilizing a conventional resist developer. In embodiments, the photoresist can be an upper component of a lithographic stack that can also include other masking layers such as antireflective coatings. The developed photoresist material has a desired pattern that is then transferred to the layer or stack of material layers that need to be patterned by etching. Etching can include dry etching and/or chemical wet etching. In one embodiment, a dry etch such as, for example, reactive ion etching (RIE), ion beam etching (IBE), plasma etching or any combination thereof can be used to transfer the pattern to the layer or stack of material layers that need to be patterned. In the present application, a lithographic stack including a photoresist is formed and the exposing, developing and etching is performed utilizing the lithographic stack. The lithographic stack can be formed utilizing a deposition process including, for example, chemical vapor deposition (CVD), plasma enhanced chemical vapor deposition (PECVD), physical vapor deposition (PVD), evaporation, spin-on coating or any combination thereof. In FIG. 2, a patterned lithographic stack 28 is shown. This patterned lithographic stack 28 is removed from the structure prior to proceeding with the processing illustrated in FIG. 3 utilizing one or material removal process. The photoresist of the patterned lithographic stack 28 can be removed after the pattern is initially transferred into other material layers present in the patterned lithographic stack 28. It is noted that the etch mentioned above removes the hard mask cap 20, the sacrificial gate structure 18 and a portion of the nanosheet stack containing structure of semiconductor channel material nanosheets 16, sacrificial semiconductor material nanosheets 15 and the inner spacers 17 (i.e., NSS).

Figure 3:
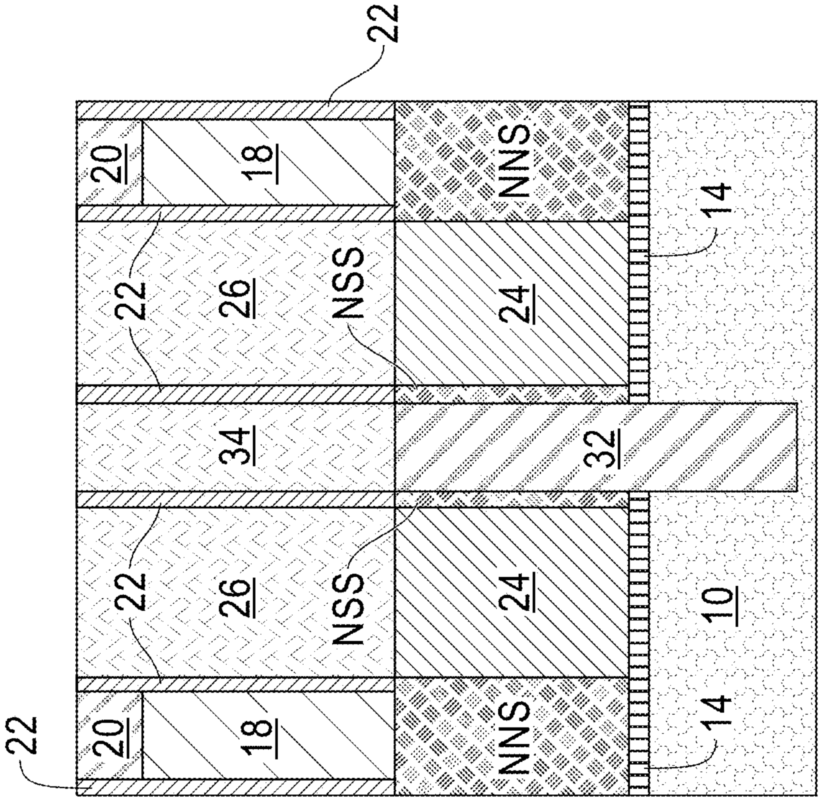
FIG. 3 is a cross sectional of the exemplary semiconductor structure shown in FIG. 2 after forming a sacrificial semiconductor placeholder structure and a frontside ILD layer in the single diffusion break region.

Referring now to FIG. 3, there is illustrated the exemplary semiconductor structure shown in FIG. 2 after forming a sacrificial semiconductor placeholder structure 32 and a frontside ILD layer 34 in the single diffusion break region 30. The sacrificial semiconductor placeholder structure 32 is composed of a placeholder material. In one embodiment, the placeholder material is composed of a fifth semiconductor material. In one example, the fifth semiconductor material is composed of a silicon germanium alloy. The sacrificial semiconductor placeholder structure 32 can be formed by deposition (e.g., CVD, PECVD or epitaxial growth) of the fifth semiconductor material, followed by a recess etch. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The sacrificial semiconductor placeholder structure 32 grows up from a semiconductor sub-surface of the semiconductor substrate 10 and outward from physically exposed sidewalls of each of the semiconductor channel material nanosheets 16 that remain along the sidewall of source/drain regions 24.

The frontside ILD layer 34, which represents a second frontside ILD layer in the structure, is composed of one of the dielectric materials mentioned above for the first frontside ILD layer 26. The dielectric material that provides the frontside ILD layer 34 can be compositionally the same as, or compositionally different from, the dielectric material that provides the first frontside ILD layer 26. The frontside ILD layer 34 can be formed by a deposition process such as, for example, CVD, PECVD or spin-on coating. A planarization process can follow the deposition process that provides the frontside ILD layer 34. At this point of the method of the present application, the frontside ILD layer 34 is separated from the first frontside ILD layer 26 by one of the gate spacers 22 that is present directly above the NSS.

Figure 4:
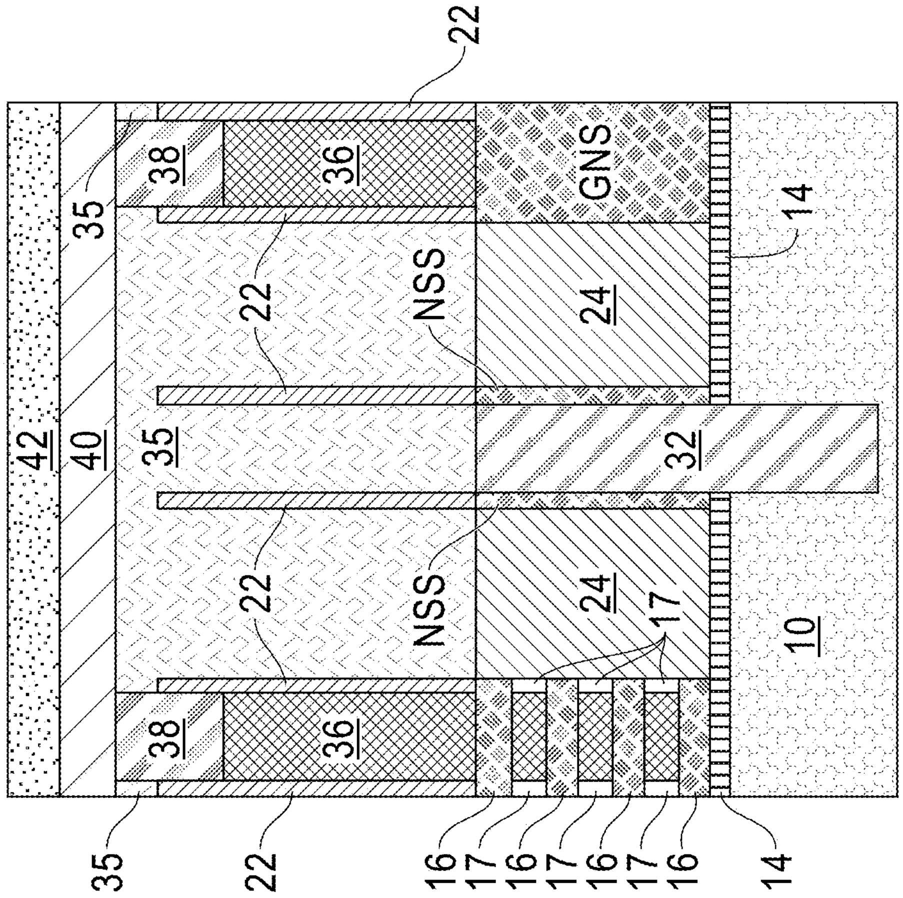
FIG. 4 is a cross sectional of the exemplary semiconductor structure shown in FIG. 3 after nanosheet processing that converts the pair of precursor nanosheet transistors into a pair of nanosheet transistors, each nanosheet transistor including a gate structure wrapped around a portion of each suspended semiconductor channel material nanosheet of a nanosheet stack, and then forming frontside gate contact structures, a frontside back-end-of-the-line (BEOL) structure, and a carrier wafer.

Referring now to FIG. 4, there is illustrated the exemplary semiconductor structure shown in FIG. 3 after nanosheet processing that converts the pair of precursor nanosheet transistors into a pair of nanosheet transistors, each nanosheet transistor including a gate structure 36 (gate structure 36 can also be referred to a functional gate structure) wrapped around a portion of each suspended semiconductor channel material nanosheet 16 of a nanosheet stack, and then forming frontside gate contact structures 38, a frontside BEOL structure 40, and a carrier wafer 42. It is noted that the left hand side of FIG. 4 details a gated nanosheet structure (GNS) that includes the gate structure 36 wrapping around each of the suspended semiconductor channel material nanosheets 16 with inner spacers 17 serves as supports for the suspended semiconductor channel material nanosheets. For simplicity the gated nanosheet structure on the right hand side of FIG. 4 is shown as single block labeled as GNS. In each of the remaining drawings each gated nanosheet structure GNS is illustrated as a single block.

Nanosheet processing includes revealing the nanosheet stacks of each precursor nanosheet transistors by removing the hard mask cap 20 and the sacrificial gate structure 18 that are present on the nanosheet stacks. Each hard mask cap 20 can be removed utilizing a material removal process such as, for example, etching, which is selective in removing the hard mask material that provides each hard mask cap 20. This material removal step reveals the underlying sacrificial gate structure 18. Each sacrificial gate structures 18 can be removed from the structure utilizing a material removal process such as, for example, etching, which is selective in removing the sacrificial gate structures 18. During the removal of the hard mask caps 20 and the sacrificial gate structures 18 an upper portion of each gate spacer 22 can be removed. These material removal steps reveal the underlying nanosheet stacks. After revealing the nanosheet stacks, each sacrificial semiconductor material nanosheet 15 is removed. The removal of the sacrificial semiconductor material nanosheet 15 suspends a portion of each semiconductor channel material nanosheet 16. Each sacrificial semiconductor material nanosheet 15 is removed utilizing any material removal process such as, for example, etching, which is selective in removing the sacrificial semiconductor material nanosheets 15.

The gate structure 36 is formed in the area previously accompanied by the sacrificial semiconductor material nanosheets 15 each of the nanosheet stacks. The gate structure 36 wraps around each of the semiconductor material nanosheets 16 within the nanosheet stacks. The gate structure 36 includes a gate dielectric layer and a gate electrode; both the gate dielectric layer and the gate electrode are not separately shown in the drawing, but both are included in the area shown as the gate structure 36. As is known, the gate dielectric layer is formed directly around the suspended portion of each semiconductor channel material nanosheet 16 and the gate electrode is formed on the gate dielectric layer. The gate dielectric layer of the gate structure is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode of the gate structure 36 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. “N-type threshold voltage shift” as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, “threshold voltage” is the lowest attainable gate voltage that will turn on a semiconductor device, e.g., transistor, by making the channel of the device conductive. The term “p-type threshold voltage shift” as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 36 can be formed by deposition of the gate dielectric material and the gate electrode material, followed by a planarization process.

The frontside gate contact structures 38 can be formed by a metallization process. Each frontside gate contact structure contacts the gate electrode of the gate structure 36. Prior to the metallization process, additional ILD material is formed (via a deposition process) on the surface of the structure including the first frontside ILD layer 26 and frontside ILD layer 34. The additional ILD material is typically compositionally the same as both the first frontside ILD layer 26 and frontside ILD layer 34. Collectively, the additional ILD material, the first frontside ILD layer 26 and frontside ILD layer 34 provide a middle-of-the-line (MOL) dielectric layer 35. The metallization process includes forming contact openings in the MOL dielectric layer 35 and then filling (including deposition and planarization) those contact openings with at least a contact conductor material. The contact conductor material that can be used for providing the frontside contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside gate contact structures 38 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. Although not shown, frontside source/drain contact structure can be formed into the MOL dielectric layer 25 and in contact with one of the source/drain regions 24.

The frontside BEOL structure 40 can include one or more interconnect dielectric material layers (including one of the dielectric materials mentioned above for the first frontside ILD layer 26) that contain frontside metal wires (the metal wires can be composed of any electrically conductive metal or electrically conductive metal alloy) embedded therein. Electrical contact of the frontside BEOL structure 40 to each frontside gate contact structure 38 is made.

The carrier wafer 42 can include one of the semiconductor materials mentioned above for the semiconductor substrate 10. Carrier wafer 42 is bonded to the frontside BEOL structure 40 after frontside BEOL structure 40 formation. This concludes the frontside processing of the semiconductor device of the present application.

Figure 5:
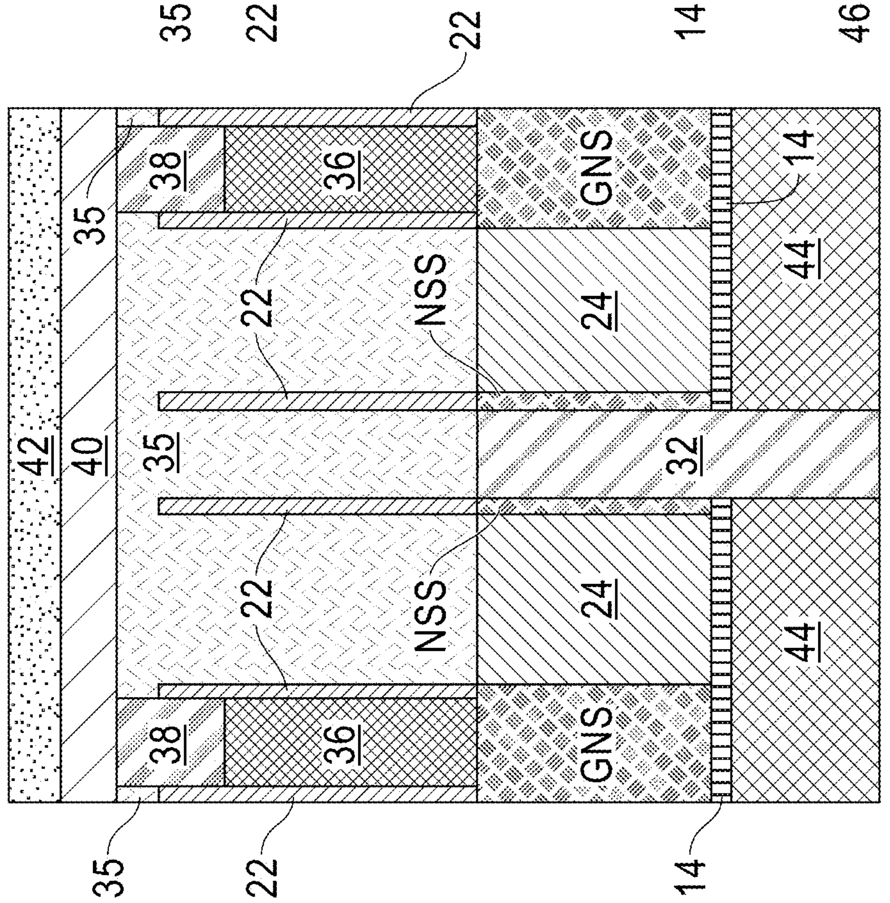
FIG. 5 is a cross sectional of the exemplary semiconductor structure shown in FIG. 4 after removing the semiconductor substrate, and forming a first backside ILD layer.

Referring now to FIG. 5, there is illustrated the exemplary semiconductor structure shown in FIG. 4 after removing the semiconductor substrate 10, and forming a first backside ILD layer 44. The removal of the semiconductor substrate 10 typically includes flipping the wafer 1800 to physically expose a backside of the semiconductor substrate 10. This flipping step is not shown in the drawings of the present application for clarity. The flipping physically exposes the semiconductor substrate 10 for backside processing. Flipping can be performed by hand or by utilizing a mechanical means such as, for example, a robot arm. In the illustrated embodiment, the removal of the physically exposed semiconductor substrate 10 can include one or more material removal process that is(are) selective in removing the semiconductor substrate 10. In embodiments in which the semiconductor substrate 10 includes a first semiconductor layer, an etch stop layer and a second semiconductor, three separate material removal processes can be employed. In such an embodiment, the first removal process removes the first semiconductor layer stopping on the etch stop layer. The second removal process removes the etch stop layer stopping on the first semiconductor layer. The third removal process then removes the second semiconductor layer.

The first backside ILD layer 44 is then formed. The first backside ILD layer 44 is composed of one of the dielectric materials mentioned above for the first frontside ILD layer 26. The first backside ILD layer 44 can be formed by a deposition process such as, for example, CVD, PECVD or spin-on coating. A planarization process can follow the deposition process that provides the first backside ILD layer 44. As is shown in FIG. 44, the first backside ILD layer 44 embeds sacrificial semiconductor placeholder structure 32 and has a surface that is substantially coplanar with a surface of the sacrificial semiconductor placeholder structure 32.

Figure 6:
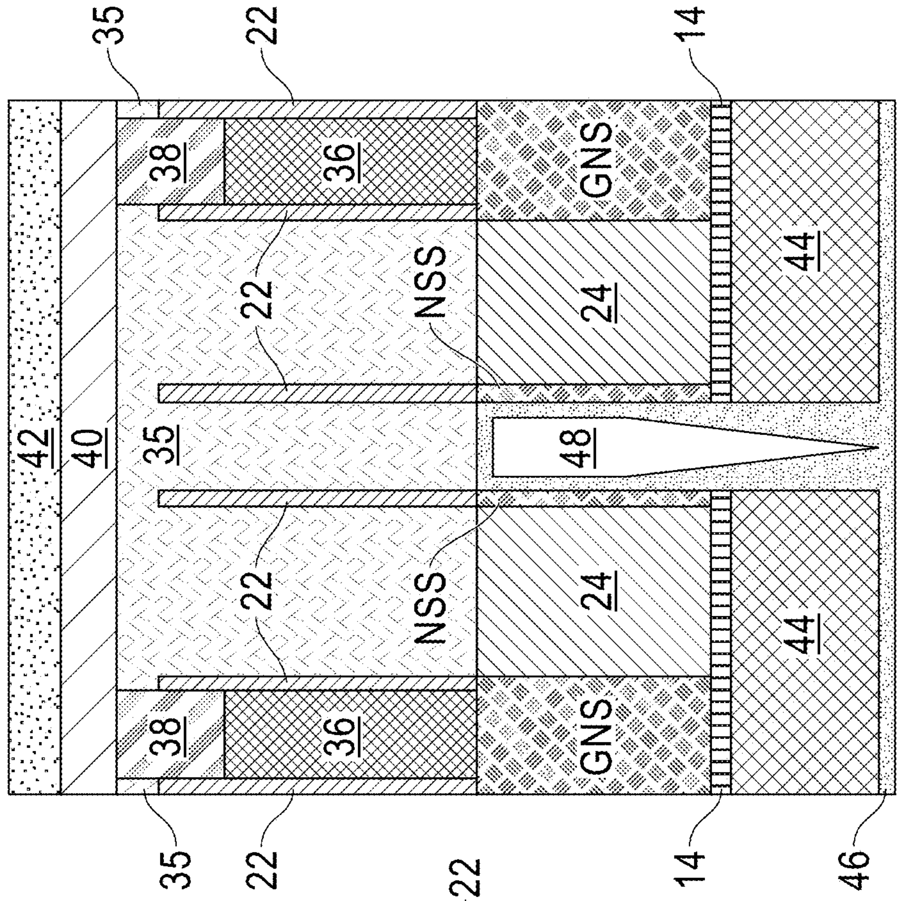
FIG. 6 is a cross sectional of the exemplary semiconductor structure shown in FIG. 5 after removing sacrificial semiconductor placeholder structure and forming an airgap containing SDB in the region previously occupied by the sacrificial semiconductor placeholder structure.

Referring now to FIG. 6, there is illustrated the exemplary semiconductor structure shown in FIG. 5 after removing sacrificial semiconductor placeholder structure 32 and forming an airgap containing SDB in the region previously occupied by the sacrificial semiconductor placeholder structure 32. The removal of the sacrificial semiconductor placeholder structure 32 includes any material removal process such as, for example, etching, which is selective in removing the removing sacrificial semiconductor placeholder structure 32. A lower portion of the previously formed single diffusion break region 30 is now physically exposed.

The airgap containing SDB is formed into this physically exposed lower portion of the previously formed single diffusion break region 30. The airgap containing SDB includes an airgap 48 that is surrounded by a SDB dielectric layer 46. The SDB dielectric layer 46 is a non-conformal dielectric layer that is present along the sidewalls of the nanosheet stack structure NSS that remains, the bottom dielectric isolation 14 and the first backside ILD layer 44. The SDB dielectric layer 46 is also present along a physically exposed horizontal surface of the first backside ILD layer 44. The SDB dielectric layer 46 is composed of a SDB dielectric material such as, for example, SiC, SiOC, or SiOCN. The SDB dielectric layer 46 is formed by a non-conformal deposition such that a pinch off of the deposition dielectric material occurs at the bottom of the physically exposed lower portion of the previously formed single diffusion break region 30 providing the airgap 48. That is, the pinch-off of the SDB dielectric layer 46 occurs adjacent to a lower portion of the first backside ILD layer 44 as shown in FIG. 6.

As is illustrated in FIG. 6, airgap 48 has an upper region adjacent to the source/drain regions 24 of the neighboring nanosheet transistors that has a first width and a lower region adjacent to the first backside ILD layer 44 that has a second width that is less than the first width. In the present application and as shown in FIG. 6, the airgap containing SDB of the present application is at the level of the source/drain regions 24 and can extend into the first backside ILD layer 44. In embodiments, the airgap containing SDB of the present application can minimize leakage as well as capacitance.

Figure 7:
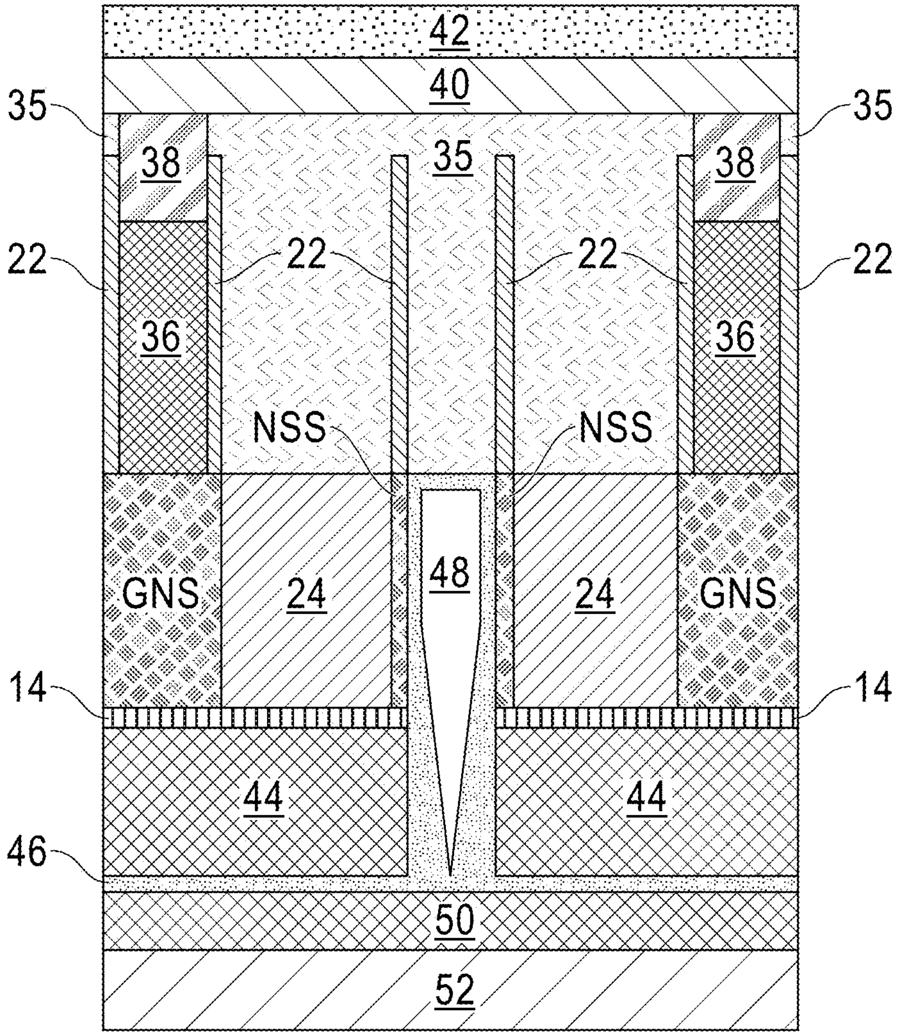
FIG. 7 is a cross sectional of the exemplary semiconductor structure shown in FIG. 6 after forming a second backside ILD layer and a backside interconnect structure.

Referring now to FIG. 7, there is illustrated the exemplary semiconductor structure shown in FIG. 6 after forming a second backside ILD layer 50 and a backside interconnect structure 52. The second backside ILD layer 50 is formed on a physically exposed surface of the SDB dielectric layer 46. The second backside ILD layer 50 can be composed of one of the dielectric materials above for the first ILD layer 26. The dielectric material that provides the second backside ILD layer 50 can be compositionally the same as, or compositionally different from, the dielectric material that provides the first backside ILD layer 44. The dielectric materials that provide the second backside ILD layer 50 and the first backside ILD layer 44 are compositionally different than the SDB dielectric material that provides the SDB dielectric layer 46. The second backside ILD layer 50 can be formed by a deposition process including, for example. CVD, PECVD or spin-on coating. Although not shown in the present application, it is possible to have backside source/drain contact structures formed in the backside ILD layers that contact at least one of the source/drain regions 24.

The backside interconnect structure 52 is then formed in contact with the second backside ILD layer 50. The backside interconnect structure 52 can be used in the present application as backside power distribution network (BSPDN). The backside interconnect structure 52 includes ILD layers having backside metal wires (the metal wires can be composed of any electrically conductive metal or electrically conductive metal alloy) embedded.

Notably, and as illustrated in FIG. 7, the semiconductor structure includes a pair of neighboring transistors, each transistor of the pair of neighboring transistors includes source/drain regions 24 located on opposite sides of a gate structure 36 (i.e., the gate structure that is within GNS shown in FIG. 7). A first backside ILD layer 44 is located beneath each transistor and the source/drain regions 24. A SDB containing an airgap (including SDB dielectric layer 46 and airgap 48) is located between the source/drain regions 24 of the pair of neighboring transistors and extends through the first backside ILD layer 44. As is evidenced in FIG. 7, the airgap 48 has an upper region having a first width adjacent to the source/drain regions 24 and a lower region having a second width that is less than the first width adjacent to the first backside ILD layer 44.

In embodiments of the present application and as is illustrated in FIG. 7, the SDB further includes SDB dielectric layer 46 surrounding the airgap 48 and located on a surface of the first backside ILD layer 44.

In embodiments of the present application and as is illustrated in FIG. 7, the semiconductor structure can further include second backside ILD layer 50 located beneath the first backside ILD layer 44.

In embodiments of the present application and as is illustrated in FIG. 7, the second backside ILD layer 50 is spaced apart from the first backside ILD layer 44 by the SDB dielectric layer 46 that is located on the surface of the first backside ILD layer 44.

In embodiments of the present application and as is illustrated in FIG. 7, the structure can further include backside interconnect structure 52 in contact with the second backside ILD layer 50.

In embodiments of the present application and as is illustrated in FIG. 7, the SDB dielectric layer 46 and a nanosheet stack structure NSS separate the airgap 48 from the source/drain regions 24.

In embodiments of the present application and as is illustrated in FIG. 2, the nanosheet stack structure NSS includes semiconductor channel material nanosheets 16, sacrificial semiconductor material nanosheets 15 and inner spacers 17.

In embodiments of the present application and as is illustrated in FIG. 7, the structure can further include gate spacer 22 located on a surface of the nanosheet stack structure NSS.

In embodiments of the present application and as is illustrated in FIG. 7, the structure can further include frontside gate contact structure 38 contacting a gate electrode of each gate structure 36 and embedded in frontside MOL dielectric layer 35.

In embodiments of the present application and as is illustrated in FIG. 7, the structure can further include frontside BEOL structure 40 in electrical contact with the frontside gate contact structure 38.

In embodiments of the present application and as is illustrated in FIG. 7, the structure can further include carrier wafer 42 located on a surface of the frontside BEOL structure 40.

In embodiments of the present application and as is illustrated in FIG. 7, the each of the transistors is a nanosheet transistor.

In embodiments of the present application and as is illustrated in FIG. 7, the structure can further include bottom dielectric isolation layer 14 located beneath each of the transistors and the source/drain regions 24.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
- a pair of neighboring transistors, each transistor of the pair of neighboring transistors comprises source/drain regions located on opposite sides of a gate structure;
- a first backside interlayer dielectric (ILD) layer located beneath each transistor and the source/drain regions; and
- a single diffusion break (SDB) containing an airgap located between the source/drain regions of the pair of neighboring transistors and extending through the first backside ILD layer, wherein the airgap has an upper region having a first width adjacent to the source/drain regions and a lower region having a second width that is less than the first width adjacent to the first backside ILD layer.

2. The semiconductor structure of claim 1, wherein the SDB further comprises a SDB dielectric layer surrounding the airgap and located on a surface of the first backside ILD layer.

3. The semiconductor structure of claim 2, further comprising a second backside ILD layer located beneath the first backside ILD layer.

4. The semiconductor structure of claim 3, wherein the second backside ILD layer is spaced apart from the first backside ILD layer by the SDB dielectric layer that is located on the surface of the first backside ILD layer.

5. The semiconductor structure of claim 4, further comprising a backside interconnect structure in contact with the second backside ILD layer.

6. The semiconductor structure of claim 2, wherein the SDB dielectric layer and a nanosheet stack structure separate the airgap from the source/drain regions.

7. The semiconductor structure of claim 6, wherein the nanosheet stack structure comprises a semiconductor channel material nanosheets, sacrificial semiconductor material nanosheets and inner spacers.

8. The semiconductor structure of claim 7, further comprising a gate spacer located directly on a topmost surface of the nanosheet stack structure and extending into a frontside middle-of-the-line (MOL) dielectric layer that is located above the source/drain regions.

9. A semiconductor structure comprising:
- a pair of neighboring nanosheet transistors, each nanosheet transistor of the pair of neighboring nanosheet transistors comprises source/drain regions located on opposite sides of a gate structure;
- a bottom dielectric isolation layer located beneath each nanosheet transistor and the source/drain regions;
- a first backside interlayer dielectric (ILD) layer located beneath the bottom dielectric isolation layer; and
- a single diffusion break (SDB) containing an airgap located between the source/drain regions of the pair of neighboring transistors and extending through bottom dielectric isolation layer and the first backside ILD layer, wherein the airgap has an upper region having a first width adjacent to the source/drain regions and a lower region having a second width that is less than the first width adjacent to the first backside ILD layer.

10. The semiconductor structure of claim 9, wherein the SDB further comprises a SDB dielectric layer surrounding the airgap and located on a surface of the first backside ILD layer.

11. The semiconductor structure of claim 10, further comprising a second backside ILD layer located beneath the first backside ILD layer.

12. The semiconductor structure of claim 11, wherein the second backside ILD layer is spaced apart from the first backside ILD layer by the SDB dielectric layer that is located on the surface of the first backside ILD layer.

13. The semiconductor structure of claim 12, further comprising a backside interconnect structure in contact with the second backside ILD layer.

14. A method of forming a semiconductor structure, the method comprising:
- forming a single diffusion break region between source/drain regions of a neighboring pair of sacrificial gate structures, the single diffusion break region extending into a semiconductor substrate;
- forming a sacrificial semiconductor placeholder structure and a frontside interlayer dielectric (ILD) layer in the single diffusion break region;
- replacing each sacrificial gate structure with a functional gate structure;
- removing the semiconductor substrate;
- forming a first backside ILD layer embedding the sacrificial semiconductor placeholder structure;
- removing sacrificial semiconductor placeholder structure; and
- forming an airgap containing SDB in a lower portion of the single diffusion break region.

15. The method of claim 14, wherein the forming the airgap containing SDB comprises non-conformal deposition of a SDB dielectric layer, wherein a pinch-off of the SDB dielectric layer occurs adjacent to the a lower portion of the first backside ILD layer.

16. The method of claim 14, further comprising a second backside ILD layer on a surface of the SDB dielectric layer that is present on a surface of the first backside ILD layer.

17. The method of claim 16, further comprising forming a backside interconnect structure on the second backside ILD layer.

18. The method of claim 14, further comprising forming a frontside back-end-of-the-line (BEOL) structure in electrical contact with a gate electrode of each functional gate structure.

19. The method of claim 18, wherein the airgap of the airgap containing SDB has an upper region having a first width adjacent to the source/drain regions and a lower region having a second width that is less than the first width adjacent to the first backside ILD layer.

20. The method of claim 14, wherein the sacrificial semiconductor placeholder structure is formed by an epitaxial growth process.

* * * * *